United States Patent
Yanase et al.

(10) Patent No.: US 9,670,089 B2
(45) Date of Patent: Jun. 6, 2017

(54) GLASS SHEET

(75) Inventors: Tomoki Yanase, Otsu (JP); Takashi Murata, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 44 days.

(21) Appl. No.: 13/382,650

(22) PCT Filed: Jul. 7, 2010

(86) PCT No.: PCT/JP2010/061542
§ 371 (c)(1),
(2), (4) Date: Jan. 6, 2012

(87) PCT Pub. No.: WO2011/004844
PCT Pub. Date: Jan. 13, 2011

(65) Prior Publication Data
US 2012/0114904 A1    May 10, 2012

(30) Foreign Application Priority Data

Jul. 8, 2009   (JP) ................................ 2009-161932
Mar. 15, 2010  (JP) ................................ 2010-057024

(51) Int. Cl.
| | | |
|---|---|---|
| C03C 3/04 | (2006.01) | |
| C03C 3/062 | (2006.01) | |
| C03C 4/00 | (2006.01) | |
| C03C 3/091 | (2006.01) | |
| C03C 3/095 | (2006.01) | |
| C03C 3/097 | (2006.01) | |
| H01L 51/52 | (2006.01) | |
| H05B 33/04 | (2006.01) | |

(52) U.S. Cl.
CPC ............ *C03C 4/0092* (2013.01); *C03C 3/062* (2013.01); *C03C 3/091* (2013.01); *C03C 3/095* (2013.01); *C03C 3/097* (2013.01); *H01L 51/524* (2013.01); *H01L 51/5275* (2013.01); *H05B 33/04* (2013.01); *H01L 2251/5361* (2013.01); *Y10T 428/24355* (2015.01)

(58) Field of Classification Search
CPC ................ C03C 3/062–3/118; C03C 4/0092
USPC ................................................. 428/141, 220
See application file for complete search history.

(56) References Cited

U.S. PATENT DOCUMENTS

| | | | | |
|---|---|---|---|---|
| 2,523,265 A | * | 9/1950 | Armistead ............... | C03C 3/089 501/61 |
| 5,300,467 A | * | 4/1994 | Ishizaki .................. | C03C 3/064 501/67 |
| 5,332,700 A | | 7/1994 | Yamaguchi et al. | |
| 5,508,237 A | * | 4/1996 | Moffatt et al. .................. | 501/69 |
| 5,565,389 A | * | 10/1996 | Kassner .......................... | 501/74 |
| 6,776,007 B2 | | 8/2004 | Hirota et al. | |
| 6,815,070 B1 | | 11/2004 | Bürkle et al. | |
| 2002/0059811 A1 | * | 5/2002 | Landa et al. ....................... | 65/45 |
| 2003/0043571 A1 | | 3/2003 | Toguchi et al. | |
| 2004/0018933 A1 | * | 1/2004 | Ogino et al. ..................... | 501/45 |
| 2004/0121893 A1 | | 6/2004 | Minamikawa et al. | |
| 2005/0026767 A1 | * | 2/2005 | Takase .................. | C03B 5/1675 501/56 |
| 2005/0127832 A1 | | 6/2005 | Toguchi et al. | |
| 2005/0269951 A1 | | 12/2005 | Handa et al. | |
| 2007/0132371 A1 | * | 6/2007 | Liu .............................. | 313/504 |
| 2008/0076656 A1 | | 3/2008 | Suzuki et al. | |
| 2009/0072733 A1 | | 3/2009 | Funayama et al. | |
| 2009/0153972 A1 | | 6/2009 | Nakamura et al. | |
| 2009/0233782 A1 | * | 9/2009 | Sasai .............................. | 501/78 |
| 2009/0270242 A1 | | 10/2009 | Yanase et al. | |
| 2010/0300536 A1 | * | 12/2010 | Aitken et al. ................. | 136/260 |

FOREIGN PATENT DOCUMENTS

| | | |
|---|---|---|
| JP | 2001-509126 | 7/2001 |
| JP | 2003-45643 | 2/2003 |
| JP | 2003-100445 | 4/2003 |
| JP | 2004-103525 | 4/2004 |
| JP | 2008-280189 | 11/2008 |
| JP | 2009-13052 | 1/2009 |
| KR | 10-2001-0105329 | 11/2001 |
| KR | 10-2004-0094861 | 11/2004 |
| WO | 98/32706 | 7/1998 |
| WO | WO 2008032742 A1 * | 3/2008 |
| WO | 2008/149888 | 12/2008 |

OTHER PUBLICATIONS

JPO Website Machine English Tranlsation of JP 2005-255478, Miwa, Shinikichi, Sep. 22, 2005.*
International Search Report issued Aug. 10, 2010 in International (PCT) Application No. PCT/JP2010/061542.
Glass Kogaku Hand Book, 1$^{st}$ Edition, 1$^{st}$ print, Asakura Publishing Co., Ltd., Jul. 5, 1999, p. 533.
International Preliminary Report on Patentability and Written Opinion of the International Searching Authority issued Feb. 23, 2012 in International (PCT) Application No. PCT/JP2010/061542.
Extended European Search Report issued Feb. 11, 2014 in European Patent Application No. 10797155.8.
Office Action issued Mar. 24, 2015 in corresponding Chinese Application No. 201080023324.7 (with English translation).

* cited by examiner

*Primary Examiner* — Laura Auer
(74) *Attorney, Agent, or Firm* — Wenderoth, Lind & Ponack, L.L.P.

(57) ABSTRACT

A glass sheet has a thickness of 2 mm or less and has a refractive index nd of 1.60 or more. The glass sheet allows light emitted from an organic light-emitting layer to be efficiently extracted to the outside and has high gas-barrier properties. The glass sheet comprises 15-40 mass % of BaO.

15 Claims, No Drawings

GLASS SHEET

TECHNICAL FIELD

The present invention relates to a glass sheet suitable for a lighting device, an OLED device, and the like, in particular, a glass sheet suitable for an OLED lighting device. Note that this glass sheet also includes a thin glass film having a film-like shape, and more specifically, a glass film having a thickness of 150 μm or less.

BACKGROUND ART

For example, a self-luminescence type electroluminescence element takes advantage of an electroluminescence (EL) phenomenon, and hence the element has various advantages such as having very little generation of heat, being light and thin, and having a low driving voltage, leading to electric power saving.

Research and development on an OLED display have been widely made conventionally in order to take advantage of these advantages. Besides, in recent years, research and development on the application of the electroluminescence element to a lighting device have also been intensified.

An OLED lighting device has a configuration in which a transparent electrode made of ITO, IZO, or the like, an organic light-emitting layer, and a back electrode formed of a metal film for light reflection are sequentially laminated on a substrate having a thickness of about 0.5 to 0.7 mm.

SUMMARY OF INVENTION

Technical Problems

In order to improve the efficiency of an OLED lighting device, it is important that light emitted from an organic light-emitting layer be efficiently extracted to the outside. However, light emitted from an organic light-emitting layer tends to reflect at the interface between a substrate and a transparent electrode, thereby returning into the organic light-emitting layer. Thus, the amount of light that can be extracted to the outside is known to be at most 15 to 20% of the total amount of emitted light.

Further, it is known that the characteristics of an organic light-emitting layer are remarkably reduced by moisture and the like. Thus, a substrate for this application is required to have a high gas-barrier property necessary for preventing moisture and the like from penetrating into a device.

Further, studies have been made on installing an OLED lighting device on a curved portion in addition to on a flat portion, and the installation on a curved portion requires the OLED lighting device to have flexibility. In order to enhance the flexibility of a substrate, studies have been conventionally made on using a resin film as a material for the substrate. However, the resin film has been difficult to impart high gas-barrier property.

An object of the present invention is to provide a substrate material, which allows light emitted from an organic light-emitting layer to be efficiently extracted to the outside and has high gas-barrier property, thereby enhancing the light extraction efficiency and reliability of an OLED lighting device or the like.

Another object of the present invention is to provide a substrate material, which has high gas-barrier property and has such flexibility that enables installation on a curved portion as well.

Solutions to Problems

The inventors of the present invention have made intensive efforts, and consequently, the inventors have found that, when the gas-barrier property is enhanced by employing a glass sheet as a substrate material and the thickness and refractive index of the glass sheet are each controlled in a predetermined range, light emitted from an organic light-emitting layer becomes difficult to reflect at the interface between a substrate and a transparent electrode, resulting in the improvement of the light extraction efficiency of an OLED lighting device or the like. Thus, the finding is proposed as the present invention. That is, a glass sheet of the present invention has a thickness of 2 mm or less and has a refractive index nd of 1.55 or more. The thickness of the glass sheet is 2 mm or less, and hence a light transmittance becomes higher. Further, the refractive index nd of the glass sheet is 1.55 or more, and hence light emitted from an organic light-emitting layer becomes difficult to reflect at the interface between a substrate and a transparent electrode. Here, the "refractive index nd" can be measured by a commercially available refractometer (for example, KPR-200, a refractometer manufactured by Kalnew Optical Industrial Co., Ltd.). It is possible to use, as a measurement sample, for example, a cuboid sample measuring 25 mm by 25 mm by about 3 mm thick produced by cutting out glass sheets each having a size of 25 mm square by dicing, and then laminating the glass sheets in a state in which an immersion liquid having a refractive index nd compatible with that of the glass sheets is saturated between the glass sheets. Further, when the glass sheet is thin and has the shape of a glass film, it is possible to use, as a measurement sample, for example, a cuboid sample measuring 25 mm by 25 mm by about 3 mm thick produced by cutting out a plurality of glass films each having a size of 25 mm square by using a laser scriber, and then laminating the glass films in a state in which an immersion liquid having a refractive index nd compatible with that of the glass films is saturated between the glass films.

The glass sheet of the present invention preferably has a refractive index nd of 1.60 or more and has a transmittance of 75% or more at a thickness of 0.7 mm and at 400 nm. Note that, in measuring the transmittance, it is possible to produce separately a glass sheet having a thickness of 0.7 mm by using the method described in paragraph [0065] or the like and to use it as a measurement sample.

The glass sheet of the present invention preferably has a thickness of 150 μm or less. The glass sheet having such thickness has excellent flexibility.

The glass sheet of the present invention preferably comprises, as a glass composition, 10 to 60 mass % of $BaO+TiO_2+Nb_2O_5+La_2O_3+ZnO+ZrO_2$ (the total of BaO, $TiO_2$, $Nb_2O_5$, $La_2O_3$, ZnO, and $ZrO_2$). Further, the glass sheet of the present invention preferably comprises, as a glass composition, 10 to 70 mass % of $BaO+TiO_2+Nb_2O_5+La_2O_3+Gd_2O_3+WO_3+Ta_2O_5+ZrO_2$ (the total of BaO, $TiO_2$, $Nb_2O_5$, $La_2O_3$, $Gd_2O_3$, $WO_3$, $Ta_2O_5$, and $ZrO_2$). In the glass sheet with such glass composition, the refractive index nd can be increased while the reduction of devitrification resistance is suppressed.

The glass sheet of the present invention preferably comprises, as a glass composition, 0 to 10 mass % of $TiO_2$ (provided that 10 mass % is excluded). $TiO_2$ has an absorption peak at around 310 nm. Thus, when the content of $TiO_2$ is 10 mass % or more, the transmittance at 400 nm lowers, and hence the light extraction efficiency tends to lower.

Further, the glass sheet of the present invention may comprise, as a glass composition, 0 to 0.1 mass % of $Fe_2O_3$ (provided that 0.1 mass % is excluded). $Fe_2O_3$ has an absorption peak at around 230 nm. Thus, when the content of $Fe_2O_3$ is 0.1 mass % or more, the transmittance at 400 nm lowers, and hence the light extraction efficiency tends to lower. Note that the content of iron oxides in the glass composition in the present invention is expressed in terms of $Fe_2O_3$.

In the glass sheet of the present invention, it is preferred that at least one surface (in the case where a front surface and a back surface are distinguished from each other, at least one surface of the front surface and the back surface) thereof comprises an unpolished surface, and the unpolished surface have a surface roughness Ra of less than 1 nm. When at least one surface comprises an unpolished surface, the glass sheet becomes hard to break. Further, when the surface roughness Ra of the unpolished surface is set to less than 1 nm, the quality of an ITO film formed on the unpolished surface improves, leading to the easy maintenance of the uniform distribution of an in-plane electric field. As a result, in-plane unevenness in luminance becomes hard to occur. Note that a resin sheet has poor surface smoothness, and hence it is difficult to increase the quality of an ITO film. Here, the term "surface roughness Ra" refers to an arithmetic average roughness defined according to JIS B0601:2001.

In the above-mentioned configuration, the other surface of the glass sheet may have a surface roughness Ra of 1 nm or more. In particular, the surface roughness of the other surface may be adjusted to 1 nm or more through surface roughening treatment. Light emitted from the organic light-emitting layer reflects at the interface between the glass sheet and air due to the difference in the reflective index of light between the glass sheet and air, and is apt to be confined in the organic light-emitting layer or the transparent electrode. As a result, the light extraction efficiency tends to lower. Such situation is prevented by adjusting the surface roughness Ra of the surface in contact with air to 1 nm or more by carrying out surface roughening treatment or the like, thereby being able to enhancing the light extraction efficiency. Further, the glass sheet of the present invention may comprise a glass film (thickness of 150 μm or less) or a resin film having a surface roughness Ra of 1 nm or more and having a refractive index compatible with that of the glass sheet, the glass film or the resin film being adhered to at least one surface of the glass sheet. Alternatively, the glass sheet of the present invention may comprise a film having a surface roughness Ra of 1 nm or more and having a refractive index compatible with that of the glass sheet, the film being formed on at least one surface of the glass sheet. In such glass sheet, the light extraction efficiency can be enhanced.

The glass sheet of the present invention preferably has a liquidus viscosity of $10^{3.5}$ dPa·s or more. Here, the term "liquidus viscosity" refers to a value obtained by measuring the viscosity of glass at its liquidus temperature by a platinum sphere pull up method. Further, the term "liquidus temperature" refers to a value obtained by measuring a temperature at which crystals of glass are deposited after glass powders that have passed through a standard 30-mesh sieve (500 μm) and remain on a 50-mesh sieve (300 μm) are placed in a platinum boat and kept in a gradient heating furnace for 24 hours. Note that, as the liquidus viscosity of glass is higher and its liquidus temperature is lower, the glass has better devitrification resistance and better formability. Conventionally, a glass sheet having a high refractive index was difficult to be formed into the plate glass, since such the glass had a low liquidus viscosity. However, when glass composition for such the glass sheet is adjusted properly to control the liquidus viscosity of the glass to $10^{3.5}$ dPa·s or more, the glass can be easily formed into the plate glass.

The glass sheet of the present invention is suitably used as a substrate and other constituents for a lighting device and an OLED device.

Further, the glass sheet of the present invention is suitably used for sealing (as a sealed substrate for) a lighting device and an OLED device.

ADVANTAGEOUS EFFECTS OF THE INVENTION

According to the present invention, there can be provided the substrate material, which allows light emitted from an organic light-emitting layer to be efficiently extracted to the outside and has high gas-barrier property, thereby enhancing the light extraction efficiency and reliability of an OLED lighting device or the like.

When the glass sheet has a configuration of thin glass film, there can be also provided the substrate material, which has high gas-barrier property and has such flexibility that enables installation on a curved portion as well.

DESCRIPTION OF EMBODIMENTS

The refractive index nd of a glass sheet of the present invention is 1.55 or more, preferably 1.58 or more, 1.60 or more, 1.62 or more, 1.65 or more, 1.68 or more, 1.70 or more, or 1.72 or more, particularly preferably 1.75 or more. When the refractive index nd of a glass sheet is less than 1.55, the probability in that light is confined in an organic light-emitting layer or an ITO film increases due to the reflection of light at the interface between the ITO film and the glass sheet, resulting in the reduction of the light extraction efficiency. On the other hand, when the refractive index nd of a glass sheet is 2.3 or more, the light extraction efficiency tends to lower due to the reflection of light at the interface between air and the glass sheet. Thus, the refractive index nd is preferably 2.3 or less, 2.2 or less, or 2.1 or less, particularly preferably 2.0 or less. Note that the refractive index nd of a glass sheet can be increased by adjusting glass composition thereof.

The thickness of the glass sheet of the present invention is preferably 2 mm or less, 1.5 mm or less, 1 mm or less, or 0.7 mm or less, particularly preferably 0.5 mm or less. Further, when flexibility is desired to be imparted to the glass sheet, the glass sheet is preferably formed in the shape of a glass film having a thinner thickness. In this case, the thickness of the glass sheet is preferably 200 μm or less, particularly preferably 150 μm or less. Further, the thickness of the glass sheet is more preferably 100 μm or less or 80 μm or less, particularly more preferably 50 μm or less, still more preferably 30 μm or less or 20 μm or less, and in particular, most preferably 10 μm or less. As the thickness of the glass sheet is smaller, the weight of a device can be reduced and the flexibility of the glass sheet can be increased. However, when the thickness is extremely too small, the glass sheet easily breaks, and hence the thickness of the glass sheet is preferably 1 μm or more or 3 μm or more, particularly preferably 5 μm or more. The glass sheet in the shape of a glass film has a possible minimum curvature radius of preferably 200 mm or less, 150 mm or less, 100 mm or less, or 50 mm or less, particularly preferably 30 mm or less. Note that, as the possible minimum curvature radius is smaller, the glass sheet has better flexibility, and hence the degree of freedom in installing an OLED lighting device or the like increases.

The transmittance of the glass sheet of the present invention at a thickness of 0.7 mm and at 400 nm is preferably 75% or more, 78% or more, 80% or more, or 85% or more, particularly preferably 90% or more. If the transmittance at 400 nm becomes lower, light emitted in an organic light-emitting layer is absorbed by the glass sheet, resulting in the reduction of the light extraction efficiency. Besides, the glass sheet of the present invention preferably has a high transmittance over the visible light range. When the transmittance at 400 nm is controlled within any of the above-mentioned ranges, the transmittance over the visible light range can also be increased. Note that, when the glass composition, in particular, the content of each of $Fe_2O_3$ and $TiO_2$, is adjusted, the transmittance at 400 nm can be increased.

The glass sheet of the present invention preferably contains, as a glass composition, 10 to 70 mass %, 10 to 60 mass %, or 30 to 70 mass % of $BaO+TiO_2+Nb_2O_5+La_2O_3+Gd_2O_3+WO_3+Ta_2O_5+ZrO_2$. When the content of $BaO+TiO_2+Nb_2O_5+La_2O_3+Gd_2O_3+WO_3+Ta_2O_5+ZrO_2$ is larger, the composition of glass loses its balance, and hence the glass is liable to devitrify. Therefore, an upper limit for the content of $BaO+TiO_2+Nb_2O_5+La_2O_3+Gd_2O_3+WO_3+Ta_2O_5+ZrO_2$ is preferably 65 mass % or less, particularly preferably 60 mass % or less or 58 mass % or less. On the other hand, when the content of $BaO+TiO_2+Nb_2O_5+La_2O_3+Gd_2O_3+WO_3+Ta_2O_5+ZrO_2$ is smaller, it becomes difficult to increase the refractive index nd of the glass sheet while the reduction of devitrification resistance is suppressed. Therefore, a lower limit for the content of $BaO+TiO_2+Nb_2O_5+La_2O_3+Gd_2O_3+WO_3+Ta_2O_5+ZrO_2$ is preferably 20 mass % or more, 30 mass % or more, 35 mass % or more, 40 mass % or more, or 45 mass % or more, particularly preferably 50 mass % or more. It should be noted that, when a mixture of two or more kinds, preferably three or more kinds, more preferably four or more kinds of $BaO$, $TiO_2$, $Nb_2O_5$, $La_2O_3$, $Gd_2O_3$, $WO_3$, $Ta_2O_5$, and $ZrO_2$ is added, the above-mentioned effect is more likely to be enjoyed.

In addition, $BaO+TiO_2+Nb_2O_5+La_2O_3+ZnO+ZrO_2$ is a component for increasing the refractive index nd while suppressing the reduction of the devitrification resistance. When the content of $BaO+TiO_2+Nb_2O_5+La_2O_3+ZnO+ZrO_2$ is larger, the composition of glass loses its balance, and hence the glass is liable to devitrify. Therefore, the content of $BaO+TiO_2+Nb_2O_5+La_2O_3+ZnO+ZrO_2$ is preferably 70% or less or 60% or less, particularly preferably 58% or less. Meanwhile, $BaO+TiO_2+Nb_2O_5+La_2O_3+ZnO+ZrO_2$ is a component for increasing the refractive index nd while suppressing the reduction of the devitrification resistance. Therefore, the content of $BaO+TiO_2+Nb_2O_5+La_2O_3+ZnO+ZrO_2$ is preferably 10% or more, 20% or more, 30% or more, 35% or more, 40% or more, or 45% or more, particularly preferably 50% or more. It should be noted that, when a mixture of two or more kinds of $BaO$, $TiO_2$, $Nb_2O_5$, $La_2O_3$, $ZnO$, and $ZrO_2$ is added, the above-mentioned effect is more likely to be enjoyed.

The glass sheet of the present invention preferably contains, as a glass composition, 0 to 10 mass % (provided that 10 mass % is excluded), 0 to 9.5 mass %, or 0 to 8 mass %, particularly preferably 0 to 7 mass % of $TiO_2$. As the content of $TiO_2$ is smaller, the transmittance at 400 nm increases, on the other hand, when the content of $TiO_2$ becomes smaller, the refractive index nd tends to lower. Thus, the content of $TiO_2$ is preferably 1 mass % or more or 2 mass % or more, particularly preferably 3 mass % or more.

The glass sheet of the present invention may contain, as a glass composition, 0 to 0.1 mass % (provided that 0.1 mass % is excluded), 0 to 0.05 mass %, 0 to 0.03 mass %, 0 to 0.02 mass %, 0 to 0.01 mass %, or 0 to 0.005 mass % of $Fe_2O_3$. As the content of $Fe_2O_3$ is larger, the transmittance at 400 nm decreases, and hence the light extraction efficiency tends to lower. Meanwhile, in order to eliminate completely the inclusion of $Fe_2O_3$ in the glass composition, it is necessary to use raw glass materials with high purity and to use production facilities specially designed so as to prevent the contamination of $Fe_2O_3$ from an apparatus for blending materials or the like into the raw glass materials. As a result, the production cost of the resultant glass sheet rises, and hence such the configuration is not practical. Thus, the content of $Fe_2O_3$ is preferably 0.001 mass % or more, particularly preferably 0.004 mass % or more. Note that each commercially available glass sheet usually contains $Fe_2O_3$ at 0.05 mass % or more in its glass composition.

In the glass sheet of the present invention, it is preferred that at least one surface thereof is an unpolished surface. The theoretical strength of glass is intrinsically very high, but glass may often breaks even by a stress far lower than the theoretical strength. This is because small defects called Griffith flow are generated on the surface of glass in some steps after shape formation, such as a polishing step. Thus, when at least one surface of the glass sheet is an unpolished surface, the intrinsically high mechanical strength of glass is hard to be impaired, and consequently, the glass sheet becomes hard to break. Further, when both surfaces of the glass sheet are unpolished surfaces, the glass sheet becomes more hard to break, and the production cost of the glass sheet can be reduced because a polishing step is eliminated.

The surface roughness Ra of an unpolished surface in the glass sheet of the present invention is preferably less than 1 nm, 5 Å or less, or 3 Å or less, particularly preferably 2 Å or less. When the surface roughness Ra of the unpolished surface is 1 nm or more, the quality of an ITO film formed on the unpolished surface lowers, and consequently, in-plane unevenness in luminance tends to occur.

In the glass sheet of The present invention, the surface roughness Ra of the other surface may be 1 nm or more. In particular, the surface roughness may be adjusted to 1 nm or more through surface roughening treatment. The surface roughness Ra of the other surface is preferably 2 nm or more or 3 nm or more, particularly preferably 5 nm or more. When the roughened other surface is set at the side in contact with air in an OLED lighting device or the like, as the roughened surface has a non-reflective structure, light emitted in the organic light-emitting layer is inhibited from returning into the organic light-emitting layer. As a result, the light extraction efficiency can be enhanced. Examples of the surface roughening treatment include etching with HF or the like, polishing, sandblasting, repressing (including nanoimprinting), and atmospheric plasma processing. On the other hand, when the surface roughness Ra of the other surface is more than 20 µm, light scattering occurs on the other surface so that the light extraction efficiency may lower. Thus, the surface roughness Ra of the other surface is preferably 20 µm or less, 15 µm or less, 10 µm or less, 5 µm or less, or 3 µm or less, particularly preferably 2 µm or less. Further, as a surface roughening treatment, a thin glass film, a thin resin film, or a thin film, each of which has at least one surface having a surface roughness Ra of 1 nm or more and has a refractive index comparable to that of the glass sheet, may be adhered on or formed in complex with the other surface of the glass sheet, with the one surface of these films facing upward.

By carrying out surface roughening treatment with heat processing such as repressing, a reflective structure (concavo-convex shape) most suitable for light extraction can be accurately formed on a surface of the glass sheet. Note that the concavo-convex shape is recommended to be formed by adjusting the interval of each concave and each convex and the depth of each concave in consideration of the refractive index nd of the glass sheet.

By carrying out surface roughening treatment with atmospheric plasma processing, the other surface of the glass sheet can be uniformly roughened, while the surface condition of the one surface of the glass sheet is maintained. Further, it is preferred to use a gas containing F (such as $SF_6$ or $CF_4$) as a source of the atmospheric plasma processing. By using such gas, a plasma containing an HF-based gas can be generated, and a surface of the glass sheet can be efficiently roughened by using the resultant plasma.

Note that, if a non-reflective structure (for example, one surface having a surface roughness Ra of 1 nm or more) is formed on a surface of the glass sheet during forming the glass sheet, such the surface can provide the same effect as the above without carrying out a surface roughening treatment.

The glass sheet of the present invention is preferably formed by an overflow down-draw method. Here, the "overflow down-draw method," also referred to as fusion method, is a method in which molten glass is allowed to overflow from both sides of a heat-resistant trough-shaped structure, and the overflown molten glasses meet with each other at the lower end of the trough-shaped structure to be drawn downwardly, to thereby produce a glass sheet. By employing such method, an unpolished glass sheet having a good surface quality can be formed. This is because, in the overflow down-draw method, the surfaces to be the surfaces of the glass sheet are formed in the state of a free surface without contacting the trough-shaped structure. The structure and material of the trough-shaped structure are not particularly limited as long as they can realize the desired size and surface quality of the glass sheet. Further, means for applying a force to the glass sheet to be drawn downwardly is not particularly limited as long as they can realize the desired size and surface quality of the glass sheet. For example, there may be employed a method involving rotating heat-resistant rolls each having a sufficiently large width and being in contact with the glass sheet, to thereby draw the glass sheet, or a method involving rotating a plurality of pairs of heat-resistant rolls each being in contact with only end surfaces of the glass sheet, to thereby draw the glass sheet.

It is also preferred that the glass sheet of the present invention be formed by a slot down-draw method. The slot down-draw method can contribute to enhancing the dimensional accuracy of the glass sheet as the overflow down-draw method can. Note that the slot down-draw method can roughen a surface of the glass sheet by changing the shape of a slot used therein.

Note that various methods other than the overflow down-draw method and the slot down method can be employed as methods of forming the glass sheet of the present invention. For example, a float method, a roll-out method, a re-draw method and the like can be employed.

The glass sheet of the present invention has a liquidus temperature of preferably 1150° C. or less, 1110° C. or less, 1090° C. or less, 1070° C. or less, 1050° C. or less, 1020° C. or less, 1000° C. or less, or 980° C. or less, particularly preferably 960° C. or less. Further, the glass sheet has a liquidus viscosity of preferably $10^{3.5}$ dPa·s or more, $10^{3.8}$ dPa·s or more, $10^{4.0}$ dPa·s or more, $10^{4.3}$ dPa·s or more, $10^{4.5}$ dPa·s or more, $10^{4.8}$ dPa·s or more, $10^{5.0}$ dPa·s or more, $10^{5.6}$ dPa·s or more, or $10^{5.8}$ dPa·s or more, particularly preferably $10^{6.0}$ dPa·s or more. Thereby, glass hardly devitrifies during forming, and hence the glass may easily be formed into a sheet by an overflow down-draw method. As a result, the surface quality of the glass sheet can be improved.

The density of the glass sheet of the present invention is preferably 5 g/cm³ or less, 4.8 g/cm³ or less, 4.5 g/cm³ or less, 4.3 g/cm³ or less, 3.7 g/cm³ or less, 3.6 g/cm³ or less, 3.4 g/cm³ or less, or 3.3 g/cm³ or less, particularly preferably 3.0 g/cm³ or less. As the density becomes lower, the weight of the device can be made lighter more easily. Here, the term "density" refers to a value obtained by measurement using a well-known Archimedes method.

In the glass sheet of the present invention, the temperature at a viscosity of $10^{2.5}$ dPa·s is preferably 1350° C. or less, 1300° C. or less, or 1270° C. or less, particularly preferably 1250° C. or less. When the temperature at a viscosity of $10^{2.5}$ dPa·s is lower, melting of the glass at a low temperature becomes easier, and the glass can be produced at a lower cost. Here, the "temperature at $10^{2.5}$ dPa·s" refers to a value obtained by measurement using the platinum sphere pull up method.

The thermal expansion coefficient of the glass sheet of the present invention is preferably $50 \times 10^{-7}$/° C. to $120 \times 10^{-7}$/° C., $60 \times 10^{-7}$/° C. to $120 \times 10^{-7}$/° C., $70 \times 10^{-7}$/° C. to $110 \times 10^{-7}$/° C., $70 \times 10^{-7}$/° C. to $100 \times 10^{-7}$/° C., particularly preferably $70 \times 10^{-7}$/° C. to $95 \times 10^{-7}$/° C. As a result of controlling the thermal expansion coefficient to any of the ranges described above, the thermal expansion coefficient of the glass sheet is likely to be compatible with the thermal expansion coefficient of each of various metal films formed on a surface of the glass sheet, and hence the warpage or the like of each metal film can be prevented. Here, the "thermal expansion coefficient" refers to an average value of the values obtained by measurement with a dilatometer in the temperature range of 30 to 380° C.

The glass sheet of the present invention has a water vapor transmission rate, under the environment of a temperature of 40° C. and a humidity of 90%, of preferably 1 g/(m²·day) or less, 0.1 g/(m²·day) or less, 0.01 g/(m²·day) or less, 0.001 g/(m²·day) or less, 0.0001 g/(m²·day) or less, 0.00001 g/(m²·day) or less, or 0.000001 g/(m²·day) or less, particularly preferably 0.0000001 g/(m²·day) or less. As a result of controlling the water vapor transmission rate to any of the ranges described above, the degradation of the characteristics of the organic light-emitting layer and the like can be prevented, and the reliability of an OLED lighting device and the like is can be enhanced.

The glass sheet of the present invention has an oxygen transmission rate, under the environment of a temperature of 40° C. and a humidity of 90%, of preferably 1 cc/(m²·day) or less, 0.1 cc/(m²·day) or less, 0.01 cc/(m²·day) or less, 0.001 cc/(m²·day) or less, 0.0001 cc/(m²·day) or less, 0.00001 cc/(m²·day) or less, or 0.000001 cc/(m²·day) or less, particularly preferably 0.0000001 cc/(m²·day) or less. As a result of controlling the oxygen transmission rate to any of the ranges described above, the degradation of the characteristics of the organic light-emitting layer and the like can be easily prevented, and the reliability of an OLED lighting device and the like can be enhanced.

The glass sheet of the present invention preferably contains, in terms of mass %, 0 to 55% of $SiO_7$, 0 to 10% of $Al_2O_3$, 0 to 20% of $B_2O_3$, 0 to 25% of MgO+CaO+SrO (the total content of MgO, CaO, and SrO), 10 to 70% of $BaO+TiO_2+Nb_2O_5+La_2O_3+Gd_2O_3+WO_3+Ta_2O_5+ZrO_2$ (or $BaO+TiO_2+Nb_2O_5+La_2O_3+ZnO+ZrO_2$), and 0 to 0.1% of $Fe_2O_3$ (provided that 0.1% is excluded) as a glass composition. The reason for the limitation of the range of the glass composition as above is described below. Note that "%" means "mass %" in the following description for the range of the glass composition.

The content of $SiO_2$ is 0 to 55%. If the content of $SiO_2$ is larger, the meltability and the formability lower and the refractive index nd tend to lower. Thus, the content of $SiO_2$ is preferably 50% or less, 45% or less, 42% or less, 40% or less, or 38% or less, particularly preferably 35% or less. On the other hand, if the content of $SiO_2$ is smaller, the network structure of glass becomes difficult to be formed, leading to difficulty in vitrification, and the viscosity of glass becomes too low, leading to difficulty in increasing its liquidus viscosity. Thus, the content of $SiO_2$ is preferably 2% or more, 5% or more, or 7% or more, particularly preferably 10% or more.

The content of $Al_2O_3$ is 0 to 10%. If the content of $Al_2O_3$ is more than 10%, devitrified crystals are likely to deposit in glass, and the liquidus viscosity tends to lower. On the other hand, if the content of $Al_2O_3$ is smaller, the composition of glass loses its balance, and hence the glass is liable to devitrify. Thus, the content of $Al_2O_3$ is preferably 0.1 to 8% or 0.5 to 6%, particularly preferably 1 to 5%.

The content of $B_2O_3$ is 0 to 20%. If the content of $B_2O_3$ is larger, the refractive index nd and the Young's modulus tend to lower. Thus, the content of $B4O_3$ is preferably 17% or less, 15% or less, particularly preferably 11% or less. Note that the addition of $B_2O_3$ can enhance the devitrification resistance. Thus, when the devitrification resistance is insufficient, $B_2O_3$ may be added at preferably 1% or more, 2% or more, or 3% or more, particularly preferably 5% or more.

MgO+CaO+SrO is a component for increasing the liquidus viscosity while increasing the refractive index nd. The content of MgO+CaO+SrO is 0 to 25%. If the content of MgO+CaO+SrO is larger, it becomes difficult to increase the liquidus viscosity. Thus, the content of MgO+CaO+SrO is preferably 22% or less, 20% or less, or 16% or less, particularly preferably 13% or less. On the other hand, if the content of MgO+CaO+SrO is smaller, it becomes difficult to increase the refractive index nd. Thus, the content of MgO+CaO+SrO is preferably 3% or more or 5% or more, particularly preferably 8% or more.

MgO is a component for increasing the refractive index nd, the Young's modulus, and the strain point, and for lowering the viscosity. However, if MgO is added in a large amount, the liquidus temperature rises, the devitrification resistance lowers, and the density and the thermal expansion coefficient become too high. Thus, the content of MgO is preferably 10% or less, 8% or less, 5% or less, 3% or less, 2% or less, 1.5% or less, or 1% or less, particularly preferably 0.5% or less.

The content of CaO is preferably 0 to 15%. If the content of CaO is larger, the refractive index nd, the density, and the thermal expansion coefficient tend to rise. However, if the content of CaO is more than 15%, the composition of glass loses its balance, and hence the glass is liable to devitrify. Thus, the content of CaO is preferably 12% or less, 10% or less, or 9% or less, particularly preferably 8.5% or less. On the other hand, if the content of CaO is smaller, the meltability, the Young's modulus, and the refractive index nd tend to lower. Thus, the content of CaO is preferably 0.5% or more, 1% or more, 2% or more, or 3% or more, particularly preferably 5% or more.

The content of SrO is preferably 0 to 15%. If the content of SrO is larger, the refractive index nd, the density, and the thermal expansion coefficient tend to rise. However, if the content of SrO is more than 15%, the composition of glass loses its balance, and hence the glass is liable to devitrify. Thus, the content of SrO is preferably 12% or less, 10% or less, or 9% or less, particularly preferably 8.5% or less. On the other hand, if the content of SrO is smaller, the meltability and the refractive index nd tend to lower. Thus, the content of SrO is preferably 0.5% or more, 1% or more, 2% or more, or 3% or more, particularly preferably 3.5% or more.

$BaO+TiO_2+Nb_2O_5+La_2O_3+Gd_2O_3+WO_3+Ta_2O_5+ZrO_2$ is a component for increasing the refractive index nd while suppressing the devitrification resistance from lowering. Note that the preferred content ranges and the like of $BaO+TiO_2+Nb_2O_5+La_2O_3+Gd_2O_3+WO_3+Ta_2O_5+ZrO_2$ are given as described above.

BaO is a component that has the largest effect of increasing the refractive index nd of glass without extremely lowering the viscosity of glass, among alkaline-earth metal oxides. The content of BaO is preferably 0 to 40%. If the content of BaO is larger, the refractive index nd, the density, and the thermal expansion coefficient tend to rise. However, if the content of BaO is more than 40%, the composition of glass loses its balance, and hence the glass is liable to devitrify. Thus, the content of BaO is preferably 35% or less. On the other hand, if the content of BaO is smaller, a desired refractive index nd is difficult to be provided to glass, and it becomes difficult to increase the liquidus viscosity. Thus, the content of BaO is preferably 0.5% or more, 1% or more, 2% or more, 5% or more, 10% or more, 15% or more, or 20% or more, particularly preferably 25% or more.

$TiO_2$ is a component for increasing the refractive index nd, but also is a component for lowering the transmittance at 400 nm. Note that the preferred content ranges and the like of $TiO_2$ are given as described above.

$Nb_2O_5$, $La_2O_3$, $Gd_2O_3$, $WO_3$, $Ta_2O_5$, and $ZrO_2$ are each a component for increasing the refractive index nd. Therefore, the content of each of $Nb_2O_5$, $La_2O_3$, $Gd_2O_3$, $WO_3$, $Ta_2O_5$, and $ZrO_2$ is preferably 1% or more, particularly preferably 3% or more. In particular, the content of $La_2O_3$ is preferably 4% or more. However, when the contents of $Nb_2O_5$, $La_2O_3$, $Gd_2O_3$, $WO_3$, $Ta_2O_5$, $ZrO_2$ are larger, the density and the thermal expansion coefficient are increased and the composition of glass loses its balance. As a result, the devitrification resistance may be excessively reduced. Therefore, the content of each of $Nb_2O_5$, $La_2O_3$, $Gd_2O_3$, $WO_3$, $Ta_2O_5$, $ZrO_2$ is preferably 35% or less, 30% or less, 25% or less, 20% or less, or 15% or less, particularly preferably 12% or less.

When the balance between the refractive index nd and the transmittance at 400 nm is taken into consideration, the value of $TiO_2/La_2O_3$ in mass ratio is preferably 0.01 to 2.45.

$Fe_2O_3$ is a component for lowering the transmittance in the ultraviolet range. Note that the preferred content ranges and the like of $Fe_2O_3$ are given as described above.

In addition to the above-mentioned components, ZnO may be contained. In this case, the content of ZnO is preferably 0 to 15%. If the content of ZnO is larger, the refractive index nd, the density, and the thermal expansion coefficient tend to rise. However, if the content of ZnO is more than 15%, the composition of glass loses its balance, and hence the glass is liable to devitrify. Thus, the content of ZnO is preferably 12% or less, 10% or less, or 9% or less, particularly preferably 8.5% or less. On the other hand, if the content of ZnO is smaller, the meltability, the Young's modulus, and the refractive index nd tend to lower. Thus, the content of ZnO is preferably 0.5% or more, 1% or more, 2% or more, or 3% or more, particularly preferably 5% or more. Further, the content of MgO+CaO+SrO+ZnO is preferably 0 to 25%. If the content of MgO+CaO+SrO+ZnO is larger, it becomes difficult to increase the liquidus viscosity. Thus, the content of MgO+CaO+SrO+ZnO is preferably 22% or less, 20% or less, or 16% or less, particularly preferably 13% or less. On the other hand, if the content of MgO+CaO+SrO+ZnO is smaller, it becomes difficult to increase the refractive index nd. Thus, the content of MgO+CaO+SrO+ZnO is preferably 3% or more or 5% or more, particularly preferably 8% or more. Besides, $BaO+TiO_2+Nb_2O_5+La_2O_3+ZnO+ZrO_2$ is a component for increasing the refractive index nd while suppressing the devitrification resistance from lowering. Note that the preferred content ranges and the like of $BaO+TiO_2+Nb_2O_5+La_2O_3+ZnO+ZrO_2$ are given as described above.

Further, in addition to the above-mentioned components, for example, the following components can be added up to 30%.

$Li_2O+Na_2O+K_2O$ (the total content of $Li_2O$, $Na_2O$, and $K_2O$) is a component for lowering the viscosity of glass and a component for adjusting the thermal expansion coefficient. However, if $Li_2O+Na_2O+K_2O$ is added in a large amount, the viscosity of glass becomes too low and it becomes difficult to increase the liquidus viscosity. Thus, the content of $Li_2O+Na_2O+K_2O$ is preferably 15% or less, 10% or less, 5% or less, 2% or less, 1% or less, or 0.5% or less, particularly preferably 0.1% or less.

$Bi_2O_3$ and $Y_2O_3$ are components for increasing the refractive index nd. However, if the content of each of $Bi_2O_3$ and $Y_2O_3$ is larger, the density and the thermal expansion coefficient rise, and the devitrification resistance may extremely lower. Thus, the content of each of $Bi_2O_3$ and $Y_2O_3$ is 0 to 30%, 0 to 25%, 0 to 20%, or 1 to 15%, particularly preferably 3 to 12%. PbO also has the effect of increasing the refractive index nd, but it is desired that PbO be not contained from the viewpoint of environment.

As a fining agent, one kind or two or more kinds selected from the group consisting of $As_2O_3$, $Sb_2O_3$, $CeO_2$, $SnO_2$, F, Cl, and $SO_3$ may be added in an amount of 0 to 3%. From the standpoint of the environment, it is necessary to refrain as much as possible from the use of $As_2O_3$, $Sb_2O_3$, or F, particularly $As_2O_3$ or $Sb_2O_3$, and the content thereof is preferably less than 0.1%. From the standpoint of the environment, $SnO_2$, Cl, and $SO_3$ are preferred as the fining agent. The content of $SnO_2+Cl+SO_3$ (the total content of $SnO_2$, Cl, and $SO_3$) is preferably 0.001 to 1% or 0.01 to 0.5%, particularly preferably 0.01 to 0.3%.

$SnO_2$ acts as a fining agent and has the effect of inhibiting $Fe_2O_3$ from absorbing light (the effect of changing the valence of Fe from trivalent to divalent). The content of $SnO_2$ is preferably 0 to 1% or 0 to 0.5%, particularly preferably 0.01 to 0.4%. Note that, if the content of $SnO_2$ is larger, the denitrification resistance tends to lower.

The glass sheet of the present invention can be produced by blending raw glass materials so as to attain a desired glass composition, then melting the glass materials, and forming the molten glass into a sheet.

EXAMPLE 1

Hereinafter, the present invention is described in detail based on examples.

Tables 1 and 2 show examples of the present invention (Sample Nos. 1 to 11).

TABLE 1

| | | Example | | | | | |
|---|---|---|---|---|---|---|---|
| | | No. 1 | No. 2 | No. 3 | No. 4 | No. 5 | No. 6 |
| Glass | $SiO_2$ | 34.6 | 34.1 | 34.6 | 37.6 | 37.6 | 37.6 |
| composition | $Al_2O_3$ | 1.5 | 1.6 | 1.5 | 1.5 | 1.5 | 1.5 |
| (mass %) | CaO | 5.9 | 5.8 | 2.9 | 5.9 | 5.9 | 5.9 |
| | SrO | 4.9 | 4.8 | 2.9 | 4.9 | 4.9 | 4.9 |
| | BaO | 27.0 | 26.9 | 27 | 27.0 | 27.0 | 27.0 |
| | $La_2O_3$ | 3.8 | 3.9 | 8.8 | 3.8 | 3.8 | 3.8 |
| | $ZrO_2$ | 3.2 | 3.2 | 3.2 | 3.2 | 3.2 | 0.2 |
| | $TiO_2$ | 9.7 | 9.6 | 9.7 | 6.7 | 9.7 | 9.7 |
| | $Nb_2O_5$ | 9.4 | 9.3 | 9.4 | 9.4 | 6.4 | 9.4 |
| | $Fe_2O_3$ | 0 | 0.010 | 0.006 | 0.009 | 0.010 | 0.006 |
| nd | | 1.74 | 1.74 | 1.74 | 1.71 | 1.72 | 1.72 |
| Sheet thickness (mm) | | 0.5 | 0.5 | 0.5 | 0.5 | 0.5 | 0.5 |
| T (%) [400 nm] | | 84 | 82 | 83 | 83 | 81 | 84 |
| ρ (g/cm³) | | 3.73 | 3.73 | 3.74 | 3.68 | 3.66 | 3.66 |
| α (×10⁻⁷/° C.) | | 78.5 | 78.5 | 74.2 | 76.7 | 76.8 | 78.4 |
| Ps (° C.) | | 709 | 700 | 712 | 712 | 711 | 701 |
| Ta (° C.) | | 747 | 744 | 751 | 752 | 750 | 739 |
| Ts (° C.) | | 876 | 876 | 881 | 887 | 881 | 867.5 |
| $10^{4.0}$ dPa · s (° C.) | | 1030 | 1032 | 1042 | 1052 | 1042 | 1026 |
| $10^{3.0}$ dPa · s (° C.) | | 1105 | 1108 | 1117 | 1131 | 1120 | 1102 |
| $10^{2.5}$ dPa · s (° C.) | | 1154 | 1158 | 1168 | 1183 | 1171 | 1152 |
| $10^{2.0}$ dPa · s (° C.) | | 1215 | 1219 | 1232 | 1246 | 1236 | 1215 |
| TL (° C.) | | 1052 | 1031 | 1061 | 1018 | 1077 | 1053 |
| logηTL (dPa · s) | | 3.7 | 4.0 | 3.7 | 4.6 | 3.5 | 3.6 |

TABLE 2

| | | \multicolumn{5}{c|}{Example} |
| --- | --- | --- | --- | --- | --- | --- |
| | | No. 7 | No. 8 | No. 9 | No. 10 | No. 11 |
| Glass composition (mass %) | $SiO_2$ | 37.6 | 37.6 | 40.6 | 43.6 | 40.6 |
| | $Al_2O_3$ | 1.5 | 1.5 | 1.5 | 1.5 | 1.5 |
| | CaO | 5.9 | 5.9 | 5.9 | 5.9 | 6.9 |
| | SrO | 4.9 | 4.9 | 4.9 | 4.9 | 5.9 |
| | BaO | 27.0 | 27.0 | 27.0 | 27.0 | 28.0 |
| | $La_2O_3$ | 6.8 | 6.8 | 6.8 | 6.8 | 6.8 |
| | $ZrO_2$ | 0.2 | 3.2 | 0.2 | 0.2 | 0.2 |
| | $TiO_2$ | 6.7 | 6.7 | 6.7 | 6.7 | 3.7 |
| | $Nb_2O_3$ | 9.4 | 6.4 | 6.4 | 3.4 | 6.4 |
| | $Fe_2O_3$ | 0.005 | 0.009 | 0.005 | 0.005 | 0.004 |
| nd | | 1.74 | 1.71 | 1.71 | 1.69 | 1.67 |
| Sheet thickness (mm) | | 0.5 | 0.5 | 0.5 | 0.5 | 0.5 |
| T (%) [400 nm] | | 85 | 82 | 85 | 85 | 86 |
| ρ (g/cm$^3$) | | 3.73 | 3.70 | 3.71 | 3.62 | 3.54 |
| α (×10$^{-7}$/° C.) | | 78.5 | 79.3 | 78.2 | 77.7 | 77.5 |
| Ps (° C.) | | 709 | 713 | 703 | 694 | 692 |
| Ta (° C.) | | 747 | 753 | 742 | 734 | 732 |
| Ts (° C.) | | 876 | 889 | 875 | 873 | 876 |
| 10$^{4.0}$ dPa · s (° C.) | | 1030 | 1038 | 1054 | 1048 | 1057 |
| 10$^{3.0}$ dPa · s (° C.) | | 1105 | 1115 | 1133 | 1132 | 1147 |
| 10$^{2.5}$ dPa · s (° C.) | | 1154 | 1166 | 1185 | 1188 | 1207 |
| 10$^{2.0}$ dPa · s (° C.) | | 1215 | 1231 | 1248 | 1257 | 1281 |
| TL (° C.) | | 1052 | 1066 | 1077 | 1026 | 1082 |
| logηTL (dPa · s) | | 3.7 | 3.6 | 3.7 | 4.3 | 3.7 |

First, raw glass materials were blended so that the resultant glass has each of the glass compositions listed in the tables, and the mixture was then fed in a glass melting furnace and melted at 1300 to 1500° C. Next, the molten glass was fed in an overflow down-draw forming apparatus and formed into a glass sheet having a width of 1000 mm and a thickness of 0.5 mm. Note that the surface roughness Ra of the glass sheet was 0.2 nm at both its surfaces.

Each glass sheet obtained as described above was evaluated for its characteristics. Tables 1 and 2 show the results.

The refractive index nd is a value obtained by measurement with a refractometer, KPR-200, manufactured by Kalnew Optical Industrial Co., Ltd. There was used, as a measurement sample, a cuboid sample measuring 25 mm by 25 mm by about 3 mm thick produced by cutting out glass sheets each having a size of 25 mm square by using a commercially available dicer, and then laminating the glass sheets in a state in which an immersion liquid having a refractive index nd compatible with that of the glass sheet is saturated between the glass sheets.

The transmittance T at 400 nm is a value obtained by measurement with UV-3100 manufactured by Shimadzu Corporation. Note that, in measuring the transmittance T, there was used a glass sheet having a thickness of 0.7 mm produced by the method described in paragraph [0065].

The density ρ is a value obtained by measurement using a well-known Archimedes method.

The thermal expansion coefficient α is an average value of the values obtained by measurement with a dilatometer in the temperature range of 30 to 380° C. Note that there was used, as a measurement sample, a sample produced by placing a plurality of glass sheets in a platinum boat, followed by remelting at 1400 to 1450° C. for 30 minutes, and then forming the molten glass into a cylindrical glass rod (having R processing at end faces) having a size of 5 mm in diameter by 20 mm in length.

The strain point Ps and the annealing point Ta are values obtained by measurement based on the method according to ASTM C336-71.

The softening point Ts is a value obtained by measurement based on the method according to ASTM C338-93.

The temperatures at 10$^{4.0}$ dPa·s, 10$^{3.0}$ dPa·s, 10$^{2.5}$ dPa·s, and 10$^{2.0}$ dPa·s are values obtained by measurement using the platinum sphere pull up method.

The liquidus temperature TL is a value obtained by measuring a temperature at which crystals of glass are deposited after glass powders that have passed though a standard 30-mesh sieve (500 μm) and remain on a 50-mesh sieve (300 μm) are placed in a platinum boat and kept in a gradient heating furnace for 24 hours.

The liquidus viscosity log ηTL is a value obtained by measuring the viscosity of glass at its liquidus temperature by the platinum sphere pull up method.

EXAMPLE 2

Further, each of the glass sheets of Sample Nos. 1 to 11 listed in Tables 1 and 2 was subjected to surface roughening treatment at one of its surfaces by using predetermined sandblast processing. As a result, the surface roughness Ra of each surface was changed from 0.2 nm to 2 μm. Thus, it is estimated that by applying the surface subjected to surface roughening treatment to the side in contact with air, the light extraction efficiency of an OLED lighting device or the like should improve.

EXAMPLE 3

Further, each of the glass sheets of Sample Nos. 1 to 11 listed in Tables 1 and 2 was subjected to surface roughening treatment at one of its surfaces by using predetermined atmospheric plasma processing. As a result, the surface roughness Ra of each surface was changed from 0.2 nm to 0.5 nm. Thus, it is estimated that by applying the surface subjected to surface roughening treatment to the side in contact with air, the light extraction efficiency of an OLED lighting device or the like should improve. Note that there was used a gas containing F as a source of the atmospheric plasma processing.

EXAMPLE 4

Hereinafter, the present invention is described in detail based on examples.

Tables 3 to 10 show examples of the present invention (Sample Nos. 12 to 78).

TABLE 3

| | | Example | | | | | | | | |
|---|---|---|---|---|---|---|---|---|---|---|
| | | No. 12 | No. 13 | No. 14 | No. 15 | No. 16 | No. 17 | No. 18 | No. 19 | No. 20 |
| Glass composition (mass %) | $SiO_2$ | 42.0 | 47.0 | 42.0 | 42.0 | 42.0 | 42.0 | 42.0 | 42.0 | 34.9 |
| | $Al_2O_3$ | 5.0 | 5.0 | 5.0 | 5.0 | 5.0 | 5.0 | 2.0 | — | 1.6 |
| | $B_2O_3$ | 4.0 | 4.0 | 9.0 | 4.0 | 4.0 | 4.0 | 4.0 | 6.0 | — |
| | MgO | — | — | — | — | — | — | 3.0 | 3.0 | — |
| | CaO | 5.8 | 5.8 | 5.8 | 5.8 | 5.8 | 5.8 | 5.8 | 5.8 | 5.8 |
| | SrO | 10.0 | 10.0 | 10.0 | 15.0 | 10.0 | 10.0 | 10.0 | 10.0 | 4.8 |
| | BaO | 33.0 | 28.0 | 28.0 | 28.0 | 28.0 | 28.0 | 33.0 | 33.0 | 26.9 |
| | $TiO_2$ | — | — | — | — | — | — | — | — | 9.6 |
| | $Nb_2O_5$ | — | — | — | — | — | — | — | — | 9.3 |
| | $La_2O_3$ | — | — | — | — | — | — | — | — | 3.9 |
| | $ZrO_2$ | — | — | — | — | — | 5.0 | — | — | 3.2 |
| | ZnO | — | — | — | — | 5.0 | — | — | — | — |
| | $SnO_2$ | 0.2 | 0.2 | 0.2 | 0.2 | 0.2 | 0.2 | 0.2 | 0.2 | — |
| nd | | 1.61 | 1.59 | 1.59 | 1.60 | 1.61 | 1.62 | 1.61 | 1.61 | 1.72 |
| T % [400 nm] | | 85 | 86 | 86 | 86 | 85 | 84 | 84 | 83 | 81 |
| $\rho$ (g/cm$^3$) | | 3.41 | 3.25 | 3.26 | 3.39 | 3.38 | 3.37 | 3.44 | 3.44 | 3.73 |
| $\alpha$ ($\times 10^{-7}$/° C.) | | 80 | 74 | 74 | 82 | 77 | 74 | 84 | 85 | 79 |
| Ps (° C.) | | 632 | 637 | 624 | 632 | 623 | 656 | 623 | 618 | 700 |
| Ta (° C.) | | 672 | 677 | 660 | 671 | 662 | 698 | 662 | 654 | 744 |
| Ts (° C.) | | 820 | 833 | 795 | 818 | 812 | 856 | 805 | 788 | 876 |
| $10^4$ dPa · s (° C.) | | 1018 | 1057 | 979 | 1015 | 1012 | 1068 | 989 | 958 | 1032 |
| $10^3$ dPa · s (° C.) | | 1120 | 1171 | 1075 | 1116 | 1116 | 1173 | 1081 | 1044 | 1108 |
| $10^{2.5}$ dPa · s (° C.) | | 1189 | 1251 | 1140 | 1184 | 1187 | 1241 | 1143 | 1101 | 1158 |
| TL (° C.) | | 1001 | 982 | 953 | 1043 | 980 | 1008 | <980 | <960 | 1031 |
| log$\eta$TL (dPa · s) | | 4.2 | 4.9 | 4.4 | 3.7 | 4.4 | 4.8 | >4.1 | >4.0 | 4.0 |

TABLE 4

| | | Example | | | | | | | | |
|---|---|---|---|---|---|---|---|---|---|---|
| | | No. 21 | No. 22 | No. 23 | No. 24 | No. 25 | No. 26 | No. 27 | No. 28 | No. 29 |
| Glass composition (mass %) | $SiO_2$ | 34.6 | 34.4 | 34.6 | 37.6 | 37.6 | 37.6 | 37.6 | 37.6 | 40.6 |
| | $Al_2O_3$ | 1.5 | 1.5 | 1.5 | 1.5 | 1.5 | 1.5 | 1.5 | 1.5 | 1.5 |
| | CaO | 5.9 | 5.9 | 2.9 | 5.9 | 5.9 | 5.9 | 5.9 | 5.9 | 5.9 |
| | SrO | 4.9 | 4.9 | 2.9 | 4.9 | 4.9 | 4.9 | 4.9 | 4.9 | 4.9 |
| | BaO | 27.0 | 26.9 | 27 | 27.0 | 27.0 | 27.0 | 27.0 | 27.0 | 27.0 |
| | $TiO_2$ | 9.7 | 9.6 | 9.7 | 6.7 | 9.7 | 9.7 | 6.7 | 6.7 | 6.7 |
| | $Nb_2O_5$ | 9.4 | 9.3 | 9.4 | 9.4 | 6.4 | 9.4 | 9.4 | 6.4 | 6.4 |
| | $La_2O_3$ | 3.8 | 3.8 | 8.8 | 3.8 | 3.8 | 3.8 | 6.8 | 6.8 | 6.8 |
| | $ZrO_2$ | 3.2 | 3.2 | 3.2 | 3.2 | 3.2 | 0.2 | 0.2 | 3.2 | 0.2 |
| | $Sb_2O_3$ | — | 0.5 | — | — | — | — | — | — | — |
| nd | | 1.74 | 1.74 | 1.74 | 1.71 | 1.72 | 1.72 | 1.71 | 1.71 | 1.69 |
| T % [400 nm] | | 82 | 82 | 82 | 83 | 82 | 82 | 83 | 83 | 83 |
| $\rho$ (g/cm$^3$) | | 3.73 | 3.75 | 3.77 | 3.68 | 3.66 | 3.66 | 3.70 | 3.71 | 3.62 |
| $\alpha$ ($\times 10^{-7}$/° C.) | | 79 | 76 | 74 | 77 | 77 | 78 | 79 | 78 | 78 |
| Ps (° C.) | | 709 | 710 | 712 | 712 | 711 | 701 | 713 | 703 | 694 |
| Ta (° C.) | | 747 | 748 | 751 | 752 | 750 | 739 | 753 | 742 | 734 |
| Ts (° C.) | | 1030 | 1032 | 1042 | 1052 | 1042 | 1026 | 1038 | 1054 | 1048 |
| $10^4$ dPa · s (° C.) | | 1105 | 1104 | 1117 | 1131 | 1120 | 1102 | 1115 | 1133 | 1132 |
| $10^3$ dPa · s (° C.) | | 1154 | 1153 | 1168 | 1183 | 1171 | 1166 | 1185 | 1188 | |
| $10^{2.5}$ dPa · s (° C.) | | 1215 | 1213 | 1232 | 1246 | 1236 | 1215 | 1231 | 1248 | 1257 |
| TL (° C.) | | 1052 | 1060 | 1061 | 1018 | 1077 | 1053 | 1066 | 1077 | 1026 |
| log$\eta$TL (dPa · s) | | 3.7 | 3.6 | 3.7 | 4.6 | 3.5 | 3.6 | 3.6 | 3.9 | 4.3 |

TABLE 5

| | | Example | | | | | | | | |
|---|---|---|---|---|---|---|---|---|---|---|
| | | No. 30 | No. 31 | No. 32 | No. 33 | No. 34 | No. 35 | No. 36 | No. 37 | No. 38 |
| Glass composition | $SiO_2$ | 43.6 | 40.6 | 37.6 | 39.0 | 38.8 | 37.6 | 37.6 | 37.6 | 37.6 |
| | $Al_2O_3$ | 1.5 | 1.5 | 1.5 | 1.5 | 1.5 | 1.5 | 1.5 | 1.5 | 1.5 |
| | CaO | 5.9 | 6.9 | 5.9 | 6.1 | 6.1 | 5.9 | 5.9 | 5.9 | 5.9 |
| | SrO | 4.9 | 5.9 | 4.9 | 5.1 | 5.1 | 4.9 | 4.9 | 4.9 | 4.9 |
| | BaO | 27 | 28 | 27 | 27.9 | 24.7 | 24 | 21 | 27 | 27 |
| | ZnO | — | — | — | — | — | 3 | 6 | — | — |

TABLE 5-continued

|  | Example | | | | | | | | |
|---|---|---|---|---|---|---|---|---|---|
|  | No. 30 | No. 31 | No. 32 | No. 33 | No. 34 | No. 35 | No. 36 | No. 37 | No. 38 |
| $TiO_2$ | 6.7 | 3.7 | 6.7 | 6.8 | 6.9 | 6.7 | 6.7 | 6.7 | 6.7 |
| $Nb_2O_5$ | 3.4 | 6.4 | 9.4 | 9.7 | 6.6 | 9.4 | 6.4 | 6.4 | 6.4 |
| $La_2O_3$ | 6.8 | 6.8 | 3.8 | 3.9 | 7 | 3.8 | 6.8 | 3.8 | 3.8 |
| $ZrO_2$ | 0.2 | 0.2 | 3.2 | — | 3.3 | 3.2 | 3.2 | 3.2 | 3.2 |
| $WO_3$ | — | — | — | — | — | — | — | 3 | — |
| $Ta_2O_5$ | — | — | — | — | — | — | — | — | 3 |
| nd | 1.67 | 1.67 | 1.71 | 1.71 | 1.70 | 1.71 | 1.71 | 1.71 | 1.71 |
| T % [400 nm] | 84 | 85 | 84 | 84 | 84 | 84 | 84 | 84 | 84 |
| ρ (g/cm³) | 3.54 | 3.64 | 3.68 | 3.69 | 3.66 | 3.68 | 3.70 | 3.71 | 3.74 |
| α (×10⁻⁷/° C.) | 78 | 82 | 77 | 79 | 77 | 75 | 74 | 76 | 76 |
| Ps (° C.) | 692 | 693 | 712 | 685 | 714 | 696 | 685 | 710 | 718 |
| Ta (° C.) | 732 | 734 | 752 | 724 | 753 | 736 | 726 | 749 | 758 |
| Ts (° C.) | 876 | 876 | 887 | 860 | 890 | 875 | 866 | 886 | 896 |
| 10⁴ dPa · s (° C.) | 1057 | 1050 | 1053 | 1021 | 1058 | 1040 | 1030 | 1050 | 1062 |
| 10³ dPa · s (° C.) | 1147 | 1133 | 1132 | 1099 | 1139 | 1119 | 1108 | 1131 | 1143 |
| 10^2.5 dPa · s (° C.) | 1207 | 1188 | 1185 | 1149 | 1192 | 1171 | 1159 | 1184 | 1196 |
| TL (° C.) | 1082 | 1020 | 1006 | 1018 | 1025 | 1030 | 1050 | 1044 | 1001 |
| logηTL (dPa · s) | 3.7 | 4.5 | 4.8 | 4.1 | 4.5 | 4.2 | 3.7 | 4.1 | 5.1 |

TABLE 6

|  |  | Example | | | | | | | | |
|---|---|---|---|---|---|---|---|---|---|---|
|  |  | No. 39 | No. 40 | No. 41 | No. 42 | No. 43 | No. 44 | No. 45 | No. 46 | No. 47 |
| Glass composition (mass %) | $SiO_2$ | 37.6 | 37.6 | 37.6 | 37.6 | 37.6 | 40.6 | 37.6 | 37.6 | 37.6 |
|  | $Al_2O_3$ | 1.5 | 1.5 | 1.5 | 1.5 | 4.5 | 1.5 | 1.5 | 1.5 | 1.5 |
|  | MgO | 3.0 | — | — | — | — | — | — | — | — |
|  | CaO | 5.9 | 5.9 | 5.9 | 5.9 | 5.9 | 5.9 | 5.9 | 5.9 | 5.9 |
|  | SrO | 4.9 | 4.9 | 4.9 | 4.9 | 4.9 | 4.9 | 4.9 | 4.9 | 4.9 |
|  | BaO | 27.0 | 27.0 | 27.0 | 27.0 | 27.0 | 27.0 | 27.0 | 27.0 | 27.0 |
|  | ZnO | — | — | 3.0 | — | — | — | — | — | — |
|  | $TiO_2$ | 6.7 | 6.7 | 6.7 | 6.7 | 6.7 | 6.7 | 6.7 | 6.7 | 6.7 |
|  | $Nb_2O_5$ | 6.4 | 6.4 | 6.4 | 6.4 | 6.4 | 6.4 | 3.4 | 3.4 | 0.4 |
|  | $La_2O_3$ | 3.8 | 3.8 | 3.8 | 3.8 | 3.8 | 3.8 | 3.8 | 6.8 | 6.8 |
|  | $Y_2O_3$ | — | 3.0 | — | — | — | — | — | — | — |
|  | $Gd_2O_3$ | — | — | — | 3.0 | — | — | 3.0 | 3.0 | 3.0 |
|  | $ZrO_2$ | 3.2 | 3.2 | 3.2 | 3.2 | 3.2 | 3.2 | 6.2 | 3.2 | 6.2 |
| nd |  | 1.71 | 1.71 | 1.71 | 1.71 | 1.69 | 1.69 | 1.70 | 1.70 | 1.70 |
| ρ (g/cm³) |  | 3.66 | 3.72 | 3.72 | 3.73 | 3.61 | 3.59 | 3.75 | 3.73 | 3.76 |
| T % [400 nm] |  | 85 | 84 | 84 | 84 | 84 | 84 | 82 | 84 | 82 |
| α (×10⁻⁷/° C.) |  | 78 | 77 | 75 | 77 | 75 | 75 | — | — | — |
| Ps (° C.) |  | 704 | 721 | 698 | 717 | 713 | 707 | 715 | 725 | 726 |
| Ta (° C.) |  | 743 | 762 | 738 | 758 | 754 | 748 | 755 | 766 | 768 |
| Ts (° C.) |  | 881 | 899 | 878 | 895 | 894 | 889 | 892 | 906 | 908 |
| 10⁴ dPa · s (° C.) |  | 1041 | 1062 | 1042 | 1059 | 1065 | 1063 | 1060 | 1076 | 1079 |
| 10³ dPa · s (° C.) |  | 1118 | 1142 | 1122 | 1139 | 1151 | 1148 | 1141 | 1158 | 1161 |
| 10^2.5 dPa · s (° C.) |  | 1168 | 1193 | 1174 | 1191 | 1207 | 1204 | 1194 | 1212 | 1214 |
| TL (° C.) |  | 1070 | 1098 | 1046 | 1017 | 1089 | 1061 | — | — | — |
| logηTL (dPa · s) |  | 3.6 | 3.5 | 3.9 | 4.7 | 3.7 | 4.0 | — | — | — |

TABLE 7

|  |  | Example | | | | | | | | |
|---|---|---|---|---|---|---|---|---|---|---|
|  |  | No. 48 | No. 49 | No. 50 | No. 51 | No. 52 | No. 53 | No. 54 | No. 55 | No. 56 |
| Glass composition (mass %) | $SiO_2$ | 37.6 | 37.6 | 37.6 | 35.3 | 35.3 | 34.8 | 34.2 | 35.2 | 34.9 |
|  | $Al_2O_3$ | 1.5 | 1.5 | 1.5 | 1.8 | — | 1.8 | 1.7 | 1.8 | 1.8 |
|  | CaO | 5.9 | 5.9 | 5.9 | 5.4 | 4.9 | 4.7 | 4 | 5.3 | 5.9 |
|  | SrO | 4.9 | 4.9 | 4.9 | 6.6 | 9.1 | 5.8 | 5 | 6.6 | 7.2 |
|  | BaO | 27 | 27 | 27 | 24.4 | 27 | 21.3 | 18.3 | 24.3 | 26.8 |
|  | $TiO_2$ | 6.7 | 6.7 | 6.7 | 8.5 | 9.8 | 8.4 | 8.3 | 8.5 | 6.1 |
|  | $Nb_2O_5$ | 0.4 | 3.4 | 3.4 | 9.4 | 9.4 | 9.2 | 9.1 | 9.4 | 9.3 |
|  | $La_2O_3$ | 3.8 | 6.8 | 3.8 | 5.8 | 1 | 11.3 | 16.7 | — | — |
|  | $Gd_2O_3$ | 6 | 3 | 6 | — | — | — | — | — | — |

TABLE 7-continued

|  |  | Example | | | | | | | | |
|---|---|---|---|---|---|---|---|---|---|---|
|  |  | No. 48 | No. 49 | No. 50 | No. 51 | No. 52 | No. 53 | No. 54 | No. 55 | No. 56 |
|  | $ZrO_2$ | 6.2 | 3.2 | 3.2 | 2.8 | 3.5 | 2.7 | 2.7 | 2.8 | 2 |
|  | $CeO_2$ | — | — | — | — | — | — | — | 6.1 | 6 |
| nd |  | 1.70 | 1.70 | 1.70 | 1.75 | 1.73 | 1.77 | 1.76 | 1.72 | 1.72 |
| T % [400 nm] |  | 84 | 84 | 84 | 80 | 80 | 79 | 79 | 82 | 82 |
| ρ (g/cm³) |  | 3.77 | 3.76 | 3.75 | 3.74 | 3.77 | 3.72 | — | — | — |
| α (×10⁻⁷/° C.) |  | — | — | — | — | — | — | — | — | — |
| Ps (° C.) |  | 729 | 716 | 715 | — | — | — | — | — | — |
| Ta (° C.) |  | 770 | 757 | 756 | — | — | — | — | — | — |
| Ts (° C.) |  | 910 | 894 | 892 | — | — | — | — | — | — |
| 10⁴ dPa·s (° C.) |  | 1083 | 1064 | 1061 | 1036 | 1027 | — | — | — | — |
| 10³ dPa·s (° C.) |  | 1165 | 1145 | 1142 | 1111 | 1100 | — | — | — | — |
| 10².⁵ dPa·s (° C.) |  | 1219 | 1199 | 1195 | 1159 | 1149 | — | — | — | — |
| TL (° C.) |  | — | 1103 | — | 1007 | 1082 | 1067 | 1163 | 1062 | 1052 |
| logηTL (dPa·s) |  | — | 3.5 | — | — | — | — | — | — | — |

TABLE 8

|  |  | Example | | | | | | | | |
|---|---|---|---|---|---|---|---|---|---|---|
|  |  | No. 57 | No. 58 | No. 59 | No. 60 | No. 61 | No. 62 | No. 63 | No. 64 | No. 65 |
| Glass | $SiO_2$ | 34.4 | 35.7 | 36.5 | 35.6 | 35.3 | 35.2 | 34.5 | 35.2 | 35.3 |
| composition | $Al_2O_3$ | 1.7 | 2 | 1.9 | 1.8 | 1.8 | 1.2 | 1.5 | 1.5 | 0.9 |
| (mass %) | CaO | 5.2 | 4.9 | 5.3 | 5.6 | 5.1 | 5.3 | 5.3 | 6 | 5.3 |
|  | SrO | 6.4 | 6.1 | 6.6 | 6.9 | 6.3 | 6.6 | 6.6 | 7.4 | 6.5 |
|  | BaO | 23.7 | 22.5 | 24.3 | 25.4 | 23.3 | 24.3 | 24.3 | 27.4 | 24.2 |
|  | $TiO_2$ | 6 | 9.7 | 8.8 | 8.6 | 8.5 | 9.3 | 9.6 | 9.8 | 9.6 |
|  | $Nb_2O_5$ | 9.1 | 10.6 | 9.7 | 9.4 | 9.3 | 9.4 | 9.3 | 9.5 | 9.3 |
|  | $La_2O_3$ | 5.6 | 5.3 | 4 | 3.9 | 7.6 | 5.7 | 5.7 | — | 5.7 |
|  | $ZrO_2$ | 2 | 3.2 | 2.9 | 2.8 | 2.8 | 3 | 3.2 | 3.2 | 3.2 |
|  | $CeO_2$ | 5.9 | — | — | — | — | — | — | — | — |
| nd |  | 1.74 | 1.75 | 1.74 | 1.74 | 1.76 | 1.75 | 1.75 | 1.72 | 1.73 |
| ρ (g/cm³) |  | — | — | — | — | — | — | — | — | — |
| α (×10⁻⁷/° C.) |  | — | — | — | — | — | — | — | — | — |
| Ps (° C.) |  | — | — | — | — | — | — | — | — | — |
| Ta (° C.) |  | — | — | — | — | — | — | — | — | — |
| Ts (° C.) |  | — | — | — | — | — | — | — | — | — |
| 10⁴ dPa·s (° C.) |  | — | — | — | — | — | 1038 | 1038 | 1032 | 1035 |
| 10³ dPa·s (° C.) |  | — | — | — | — | — | 1115 | 1113 | 1105 | 1111 |
| 10².⁵ dPa·s (° C.) |  | — | — | — | — | — | 1165 | 1161 | 1153 | 1159 |
| TL (° C.) |  | 1049 | 1123 | 1077 | 1023 | 1026 | 1025 | 1031 | 1090 | 1034 |
| logηTL (dPa·s) |  | — | — | — | — | — | — | — | — | — |

TABLE 9

|  |  | Example | | | | | | | | |
|---|---|---|---|---|---|---|---|---|---|---|
|  |  | No. 66 | No. 67 | No. 68 | No. 69 | No. 70 | No. 71 | No. 72 | No. 73 | No. 74 |
| Glass | $SiO_2$ | 35.8 | 34.5 | 34.5 | 33.7 | 34.6 | 34.6 | 34.0 | 34.6 | 34.9 |
| composition | $Al_2O_3$ | 0.9 | 1.5 | 1.5 | 2.1 | 1.5 | 1.5 | 1.5 | 0.6 | 1.2 |
| (mass %) | CaO | 6.0 | 5.9 | 5.9 | 5.9 | 5.9 | 6.0 | 5.8 | 5.7 | 5.8 |
|  | SrO | 7.4 | 3.6 | 4.9 | 3.6 | 3.7 | 3.7 | 3.6 | 7.1 | 7.1 |
|  | BaO | 27.4 | 26.8 | 25.2 | 26.9 | 27.0 | 27.1 | 26.6 | 26.2 | 26.3 |
|  | $TiO_2$ | 9.8 | 9.6 | 9.7 | 9.6 | 9.7 | 9.3 | 8.0 | 9.9 | 9.9 |
|  | $Nb_2O_5$ | 9.5 | 9.3 | 9.4 | 9.3 | 9.4 | 8.3 | 12.3 | 9.4 | 9.6 |
|  | $La_2O_3$ | — | 5.7 | 5.7 | 5.7 | 3.8 | 5.8 | 5.6 | 2.9 | 1.9 |
|  | $ZrO_2$ | 3.2 | 3.1 | 3.2 | 3.2 | 3.2 | 3.7 | 2.6 | 3.6 | 3.3 |
| nd |  | 1.72 | 1.76 | 1.76 | 1.76 | 1.75 | 1.75 | 1.75 | 1.75 | 1.74 |
| ρ (g/cm³) |  | — | 3.73 | 3.72 | 3.74 | 3.72 | 3.71 | 3.75 | 3.72 | — |
| α (×10⁻⁷/° C.) |  | — | — | — | — | 76 | — | — | — | — |
| Ps (° C.) |  | — | — | — | — | 713 | — | — | — | — |
| Ta (° C.) |  | — | — | — | — | 749 | — | — | — | — |
| Ts (° C.) |  | — | — | — | — | 878 | — | — | — | — |
| 10⁴ dPa·s (° C.) |  | 1031 | 1028 | 1034 | — | 1036 | — | 1035 | 1026 | — |
| 10³ dPa·s (° C.) |  | 1106 | 1102 | 1109 | — | 1110 | — | 1110 | 1099 | — |

TABLE 9-continued

| | Example | | | | | | | | |
|---|---|---|---|---|---|---|---|---|---|
| | No. 66 | No. 67 | No. 68 | No. 69 | No. 70 | No. 71 | No. 72 | No. 73 | No. 74 |
| $10^{2.5}$ dPa·s (° C.) | 1155 | 1150 | 1158 | — | 1160 | | 1158 | 1145 | — |
| TL (° C.) | 1063 | 1031 | 1051 | 1042 | 1023 | 1050 | 1094 | 1048 | 1049 |
| logηTL (dPa·s) | — | — | — | — | 4.1 | — | — | — | — |

TABLE 10

| | | Example | | | |
|---|---|---|---|---|---|
| | | No. 75 | No. 76 | No. 77 | No. 78 |
| Glass composition (mass %) | $SiO_2$ | 35.3 | 35.1 | 45.0 | 45.0 |
| | $Al_2O_3$ | 1.2 | 1.2 | 5.0 | 5.0 |
| | MgO | — | — | 4.2 | 4.2 |
| | CaO | 5.6 | 4.7 | 5.9 | 5.9 |
| | SrO | 7.0 | 8.6 | 10.9 | 10.9 |
| | BaO | 25.7 | 25.5 | 16.0 | 16.0 |
| | $TiO_2$ | 9.3 | 9.2 | 9.9 | 7.0 |
| | $Nb_2O_5$ | 9.6 | 9.5 | — | — |
| | $La_2O_3$ | 2.9 | 2.9 | 3.1 | 3.0 |
| | $ZrO_2$ | 3.4 | 3.3 | — | 3.0 |
| nd | | 1.74 | 1.74 | 1.66 | 1.65 |
| ρ (g/cm³) | | 3.72 | 3.74 | 3.32 | 3.34 |
| α (×$10^{-7}$/° C.) | | — | — | — | — |
| Ps (° C.) | | — | — | 684 | 692 |
| Ta (° C.) | | — | — | 724 | 734 |
| Ts (° C.) | | — | — | 867 | 883 |
| $10^4$ dPa·s (° C.) | | — | — | 1040 | 1067 |
| $10^3$ dPa·s (° C.) | | — | — | 1128 | 1158 |
| $10^{2.5}$ dPa·s (° C.) | | — | — | 1187 | 1219 |
| TL (° C.) | | 1045 | 1046 | 1064 | — |
| logηTL (dPa·s) | | — | — | 3.7 | — |

First, raw glass materials were blended so that the resultant glass has each of the glass compositions listed in the tables, and the mixture was then fed in a glass melting furnace and melted at 1500 to 1600° C. Next, the molten glass was fed in an overflow down-draw forming apparatus and formed into a glass sheet having a width of 1000 mm and a thickness of 30 μm. Note that the surface roughness Ra of the glass sheet (glass film) was 0.2 nm at both its surfaces.

Each glass sheet (glass film) obtained as described above was evaluated for its characteristics. Tables 3 to 10 show the results.

The refractive index nd is a value obtained by cutting out 100 glass films each having a size of 25 mm square by using a laser scriber, then laminating the glass films in a state in which an immersion liquid having a refractive index nd compatible with that of the glass films is saturated between the glass films, thereby producing a cuboid measurement sample measuring 25 mm by 25 mm by about 3 mm thick, and using a refractometer, KPR-200, manufactured by Kalnew Optical Industrial Co., Ltd. for calculation.

The density ρ, the strain point Ps, the annealing point Ta, the softening point Ts, the temperatures at $10^{4.0}$ dPa·s, $10^{3.0}$ dPa·s, and $10^{2.5}$ dPa·s, the thermal expansion coefficient α, the liquidus temperature TL, and the liquidus viscosity log ηTL are each a value obtained by measurement using the method described above.

Further, each of the glass films of Sample Nos. 12 to 78 was subjected to surface roughening treatment at one of its surfaces by atmospheric plasma processing using a $CF_4$ gas. As a result, the average surface roughness Ra of each surface was changed from 2 Å to 5 nm.

The invention claimed is:

1. A glass substrate, which has a thickness of 2 mm or less and has a refractive index nd of 1.55 or more, wherein the glass substrate comprises, in terms of mass %, 10 to 50% of $SiO_2$, 15 to 40% of BaO, 0 to 3% of $Ta_2O_5$, 35% or less of $Nb_2O_5$, 5% or less of $ZrO_2$, 0 to 8.5% of ZnO, less than 0.1% of $Li_2O+Na_2O+K_2O$, 0 to 6% of $B_2O_3$, 3 to less than 10% of $TiO_2$, and is free of PbO, and has a thermal expansion coefficient of $60\times10^{-7}$/° C. to $120\times10^{-7}$/° C. in a temperature range of 30 to 380° C.

2. The glass substrate according to claim 1, wherein the glass substrate has a refractive index nd of 1.60 or more and has a transmittance of 75% or more at a thickness of 0.7 mm and at a wavelength of light of 400 nm.

3. The glass substrate according to claim 1, wherein the glass substrate has a thickness of 150 μm or less.

4. The glass substrate according to claim 1, wherein the glass substrate comprises 0 to 0.1 mass % of $Fe_2O_3$.

5. The glass substrate according to claim 1, wherein at least one surface of the glass substrate comprises an unpolished surface, and the unpolished surface has a surface roughness Ra of less than 1 nm.

6. The glass substrate according to claim 5, wherein the other surface of the glass substrate has a surface roughness Ra of 1 nm or more.

7. The glass substrate according to claim 6, wherein the other surface is subjected to surface roughening treatment.

8. The glass substrate according to claim 1, wherein the glass substrate has a liquidus viscosity of $10^{3.5}$ dPa·s or more.

9. The glass substrate according to claim 1, wherein the glass substrate is used as a substrate for a lighting device or an OLED device.

10. The glass substrate according to claim 1, wherein the glass substrate is used for sealing a lighting device or an OLED device.

11. A lighting device, comprising the glass substrate according to claim 1.

12. An OLED device, comprising the glass substrate according to claim 1.

13. The glass substrate according to claim 1, wherein the glass substrate has a refractive index nd of 1.62 or more.

14. The glass substrate according to claim 1, wherein the glass substrate comprises 20 to 40 mass % of BaO.

15. The glass substrate according to claim 1, wherein the glass substrate comprises 1 to 15 mass % of SrO.

* * * * *